(12) United States Patent
Wang et al.

(10) Patent No.: US 8,592,864 B2
(45) Date of Patent: Nov. 26, 2013

(54) SEMICONDUCTOR DEVICE AND METHOD FOR FORMING THE SAME

(75) Inventors: Jing Wang, Beijing (CN); Jun Xu, Beijing (CN); Lei Guo, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 13/499,661

(22) PCT Filed: Jun. 27, 2011

(86) PCT No.: PCT/CN2011/076392
§ 371 (c)(1),
(2), (4) Date: Mar. 30, 2012

(87) PCT Pub. No.: WO2012/041087
PCT Pub. Date: Apr. 5, 2012

(65) Prior Publication Data
US 2013/0207161 A1     Aug. 15, 2013

(30) Foreign Application Priority Data
Sep. 27, 2010  (CN) .......................... 2010 1 0293093

(51) Int. Cl.
*H01L 21/02*     (2006.01)
(52) U.S. Cl.
USPC ...................... 257/190; 257/E21.09; 438/483
(58) Field of Classification Search
USPC ...................... 257/E21.09, 190; 438/479, 483
See application file for complete search history.

(56) References Cited

U.S. PATENT DOCUMENTS

| 2010/0025683 | A1  | 2/2010 | Cheng |
| 2010/0072515 | A1* | 3/2010 | Park et al. ...................... 257/190 |
| 2011/0006343 | A1  | 1/2011 | Hata et al. |

FOREIGN PATENT DOCUMENTS

| CN | 101150054 A | 3/2008 |
| CN | 101459061 A | 6/2009 |
| CN | 101609797 A | 12/2009 |
| CN | 102142454 A | 8/2011 |
| WO | 2009/110207 A1 | 9/2009 |

OTHER PUBLICATIONS

International Search Report and Written Opinion mailed on Sep. 29, 2011 for International Application No. PCT/CN2011/076392, filed Jun. 27, 2011 (11 pages).

* cited by examiner

*Primary Examiner* — Bilkis Jahan
(74) *Attorney, Agent, or Firm* — Perkins Coie LLP

(57) ABSTRACT

A semiconductor device and a method for forming the same are provided. The semiconductor device comprises: a substrate (1); an insulating layer (2), formed on the substrate (1) and having a trench (21) to expose an upper surface of the substrate (1); a first buffer layer (3), formed on the substrate (1) and in the trench (21); and a compound semiconductor layer (4), formed on the first buffer layer (3), wherein an aspect ratio of the trench (21) is larger than 1 and smaller than 10, wherein the first buffer layer (3) is formed by a low-temperature reduced pressure chemical vapor deposition process at a temperature between 200° C. and 500° C., and wherein the compound semiconductor layer (4) is formed by a low-temperature metal organic chemical vapor deposition process at a temperature between 200° C. and 600° C.

15 Claims, 6 Drawing Sheets

SEMICONDUCTOR DEVICE AND METHOD FOR FORMING THE SAME

CROSS REFERENCE TO RALATED APPLICATIONS

This application is a 35 USC §371 National Stage application of, and claims priority of, International Application No. PCT/CN2011/076392 filed Jun. 27, 2011, which further claims the benefit and priority to China Patent Application No. CN201010293093.3 filed Sep. 27, 2010. The disclosure of each of the prior applications is considered part of and is incorporated by reference in the disclosure of this application.

FIELD

The present disclosure relates to a semiconductor device and a method for forming the same, and more particularly to a semiconductor device comprising a compound semiconductor layer with a high carrier mobility and a method for forming the same.

BACKGROUND

With a scaling down of a semiconductor device, a mobility of a silicon channel may not meet a requirement of a continuous increase of a device performance. Therefore, it has become a focus to use other materials with the high mobility instead of silicon as a channel material or to introduce a strain engineering to increase the mobility of the channel.

Compound semiconductor materials such as Group III-V semiconductor materials have attracted a lot of attention due to their high mobility. Since the Si material has a scale effect in cost control and wafer size, a feasible method is to heteroepitaxially form the compound semiconductor materials on a Si wafer. However, due to a lattice mismatch between different materials, many dislocation defects may be introduced during an epitaxy, thus affecting a performance of a device.

Therefore, there is a need for a semiconductor device and a method for forming the same, in which the semiconductor device comprises a high-quality compound semiconductor layer with a low dislocation density and a low surface roughness formed on the Si wafer.

SUMMARY

The present disclosure is aimed to solve at least one of the above mentioned technical problems, particularly the problems of a high dislocation density or a high surface roughness.

According to an aspect of the present disclosure, a method for forming a semiconductor device is provided, in which the semiconductor device comprises a compound semiconductor layer with high carrier mobility.

According to another aspect of the present disclosure, a semiconductor device is provided, which comprises a compound semiconductor layer with high carrier mobility.

According to an aspect of the present disclosure, a method for forming a semiconductor device is provided, comprising: providing a substrate; forming an insulating layer on the substrate; forming a trench in the insulating layer to expose an upper surface of the substrate; forming a first buffer layer on the exposed upper surface of the substrate by a selective epitaxy; and forming a compound semiconductor layer on the first buffer layer epitaxially, wherein an aspect (height to width) ratio of the trench is larger than 1 and smaller than 10, wherein the first buffer layer is formed by a low-temperature reduced pressure chemical vapor deposition process at a temperature between 200° C. and 500° C., and wherein the compound semiconductor layer is formed by a low-temperature metal organic chemical vapor deposition process at a temperature between 200° C. and 600° C.

In one embodiment, the first buffer layer is a Ge layer, a SiGe layer with a content of Ge larger than 50 at. %, or a layer with a combination of Ge and SiGe with the content of Ge larger than 50 at. %.

In one embodiment, the content of Ge in the SiGe layer increases gradually in a growth direction of the SiGe layer.

In one embodiment, most of dislocation lines in the first buffer layer extend in an oblique direction and are stopped at an interface between the first buffer layer and the insulating layer. For example, an angle between the dislocation line and the upper surface of the substrate may be 30-65 degrees, and dislocation lines extending vertically upwards are hardly observed.

In one embodiment, the compound semiconductor layer comprises GaAs, InGaAs, InSb, InP, InAlAs, AlGaAs, or any combination thereof. In one embodiment, the combination may comprise a heterojunction structure. The heterojunction structure may include, but is not limited to, a three-layer potential well structure with two wide bandgap semiconductor layers sandwitching one narrow bandgap semiconductor layer, for example, a InGaAs/InSb/InGaAs structure.

In one embodiment, when forming the compound semiconductor layer, a HCl gas may be introduced in a growth chamber.

In one embodiment, the substrate comprises Si, SiGe with a content of Ge smaller than 30 at. %, or a combination thereof.

In one embodiment, the method for forming a semiconductor device further comprises: before forming the compound semiconductor layer, forming a second buffer layer on the first buffer layer by the low-temperature metal organic chemical vapor deposition process at a temperature between 200° C. and 600° C.

In one embodiment, the second buffer layer comprises GaAs, AlGaAs, InAlAs, AlInSb, InP, InGaAs, or any combination thereof.

In one embodiment, the compound semiconductor layer is a strained layer.

In one embodiment, the compound semiconductor layer is formed epitaxially until the compound semiconductor layer fills the trench and laterally extends onto the insulating layer. The compound semiconductor layer may extend outside the trench, and form a continuous layer on an upper surface of the insulating layer.

In one embodiment, the method for forming a semiconductor device may further comprise: removing a part of the continuous layer between adjacent trenches to form a recess; filling a dielectric in the recess to form an isolation structure; and planarizing the compound semiconductor layer and the isolation structure.

According to another aspect of the present disclosure, a semiconductor device is provided, comprising: a substrate; an insulating layer, formed on the substrate and having a trench to expose an upper surface of the substrate; a first buffer layer, formed on the substrate and in the trench; and a compound semiconductor layer, formed on the first buffer layer, in which an aspect (height to width) ratio of the trench is larger than 1 and smaller than 10, the first buffer layer is formed by a low-temperature reduced pressure chemical vapor deposition process a temperature between 200° C. and 500° C., and the compound semiconductor layer is formed by a low-temperature metal organic chemical vapor deposition process at a temperature between 200° C. and 600° C.

In one embodiment, the first buffer layer is a Ge layer, a SiGe layer with a content of Ge larger than 50 at. %, or a layer with a combination of Ge and SiGe with the content of Ge larger than 50 at. %.

In one embodiment, the content of Ge in the SiGe layer increases gradually in a growth direction of the SiGe layer.

In one embodiment, most of dislocation lines in the first buffer layer extend in an oblique direction and are stopped at an interface between the first buffer layer and the insulating layer. For example, an angle between the dislocation line and the upper surface of the substrate may be 30-65 degrees, and dislocation lines extending vertically upwards are hardly observed.

In one embodiment, the compound semiconductor layer comprises GaAs, InGaAs, InSb, InP, InAlAs, AlGaAs, or any combination thereof. In one embodiment, the combination may comprise a heterojunction structure. The heterojunction structure may include, but is not limited to, a three-layer potential well structure with two wide bandgap semiconductor layers sandwitching one narrow bandgap semiconductor layer, for example, a InGaAs/InSb/InGaAs structure.

In one embodiment, the substrate comprises Si, SiGe with a content of Ge smaller than 30 at. %, or a combination thereof.

In one embodiment, the semiconductor device further comprises: a second buffer layer formed between the first buffer layer and the compound semiconductor layer.

In one embodiment, the second buffer layer comprises GaAs, AlGaAs, InAlAs, AlInSb, InP, InGaAs, or any combination thereof.

In one embodiment, the second buffer layer is formed by the low-temperature metal organic chemical vapor deposition process at a temperature between 200° C. and 600° C.

In one embodiment, the compound semiconductor layer is a strained layer.

In one embodiment, the compound semiconductor layer fills the trench and laterally extends onto the insulating layer.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION OF EMBODIMENTS OF THE DISCLOSURE

Figure 1:
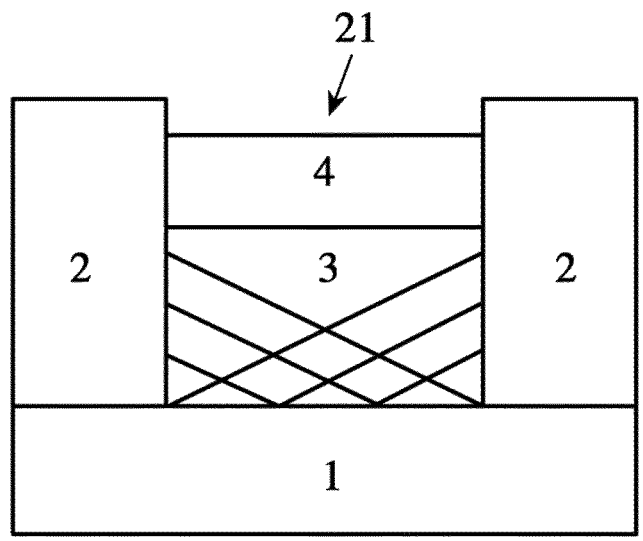
FIG. 1 is a cross-sectional view of a semiconductor device according to an exemplary embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

FIG. 1 is a cross-sectional view of a semiconductor device according to an exemplary embodiment of the present disclosure.

As shown in FIG. 1, the semiconductor device according to an exemplary embodiment of the present disclosure comprises: a substrate 1; an insulating layer 2 formed on the substrate 1; a trench 21 formed in the insulating layer 2 to expose an upper surface of the substrate 1; a first buffer layer 3 formed on the exposed surface of the substrate 1 in the trench 21; and a compound semiconductor layer 4 formed on the first buffer layer 3.

The substrate 1 may be a semiconductor substrate, including, but not limited to, a Si substrate, a SOI substrate, or a SiGe substrate with low Ge content. The upper surface of the substrate 1 may be a predetermined crystal plane. For example, as shown in FIG. 1, the substrate 1 may be a Si substrate, a surface of which may be a (100) crystal plane. In another example, the substrate 1 may also comprise a SiGe layer (not shown) with low Ge content formed epitaxially on the Si substrate, in which the content of Ge is not larger than 30 at. %, for example.

The insulating layer 2 may be of a dielectric material, including, but not limited to, $SiO_2$ and $Si_3N_4$. According to different requirements, a thickness of the insulating layer 2 may range from tens of nanometers to several microns. The trench 21 may be formed in the insulating layer 2 to expose the upper surface of the substrate 1. The trench 21 may also be, for example, a hole. Although FIG. 1 only shows one trench 21, it should be noted that a plurality of trenches 21 may be formed in the insulating layer 2. A size of the trench 21 may be determined according to the requirement. An aspect (height to width) ratio of the trench 21 may be larger than about 1, preferably, larger than about 1 and smaller than about 10, and more preferably, larger than about 2 and smaller than about 5. A selection of the aspect (height to width) ratio of the trench 21 will be described below in detail.

The first buffer layer 3 may be formed on the exposed surface of the substrate 1 in the trench 21. The first buffer layer 3 may be, for example, a Ge layer, a SiGe layer with high Ge content, or a layer with a combination of Ge and SiGe with high Ge content. In some embodiments, the first buffer layer 3 may be formed by a low-temperature reduced pressure chemical vapor deposition (RPCVD) process, for example, at a temperature between 200° C. and 500, and preferably, at a temperature between 350° C. and 500° C. In one example, the first buffer layer 3 may be a Ge layer formed by the low-temperature reduced pressure chemical vapor deposition process. In another example, the first buffer layer 3 may be a SiGe layer with high Ge content formed by the low-temperature reduced pressure chemical vapor deposition process, in which the content of Ge is larger than 50 at. %, for example, or the content of Ge may increase gradually in a growth direction of the first buffer layer 3, for example, from about 50 at. % to less than 100 at. %.

Figure 5:
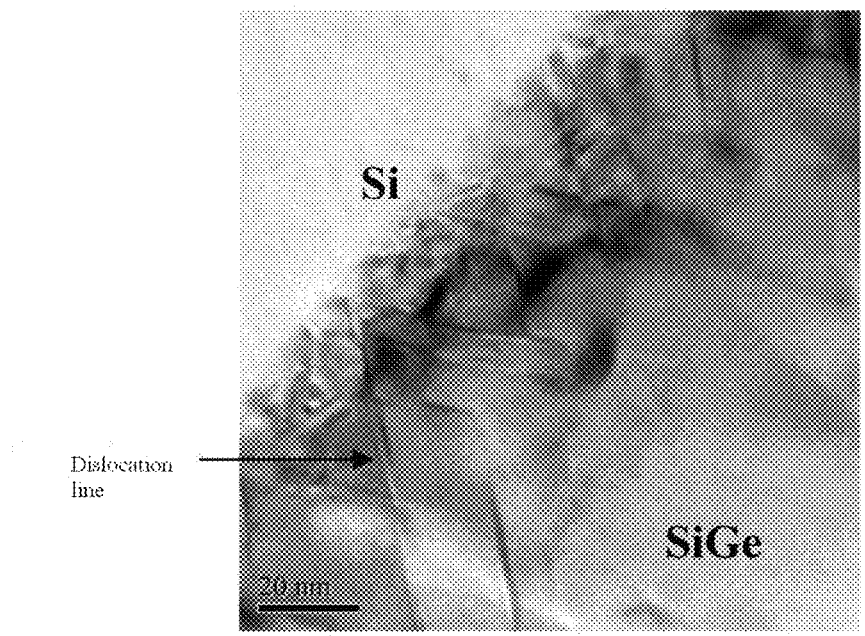
FIG. 5 shows a transmission electron microscope (TEM) image of an interface between a SiGe buffer layer and a Si substrate according to an exemplary embodiment of the present disclosure.

FIG. 5 shows a transmission electron microscope (TEM) image of an interface between a SiGe buffer layer with high Ge content formed by the low-temperature reduced pressure chemical vapor deposition process and a Si substrate according to an exemplary embodiment of the present disclosure. An epitaxial growth is performed at a temperature of 500° C., and the content of Ge in the formed SiGe buffer layer 3 is 87 at. %. Different from a conventional growth process, as shown in FIG. 1 and FIG. 5, in the first buffer layer 3 formed by the low-temperature reduced pressure chemical vapor deposition process, dislocation lines may extend in an oblique direction, and dislocation lines extending vertically upwards are hardly observed. An angle between the dislocation line and the upper surface of the substrate 1 generally ranges from 30 degrees to 65 degrees. When dislocation lines intersect with each other, they are annihilated according to the Burgers vector or continue extending obliquely upwards. In some embodiments, the first buffer layer 3 is formed in the trench 21 in the insulating layer 2. In this way, the dislocation lines in the first buffer layer 3 may be stopped at an interface between the first buffer layer 3 and the insulating layer 2. In other words, the insulating layer 2 prevents the dislocation lines in the first buffer layer 3 from further extending obliquely upwards, thus limiting the dislocation lines to a thinner region compared with a semiconductor device without the insulating layer 2. In this way, an upper part of the first buffer layer 3 may have small dislocation density and good crystal structure, and compared with the buffer layer with the same thickness in a conventional semiconductor device, the first buffer layer 3 may have a thicker region with an ideal crystal structure. The aspect (height to width) ratio of the trench 21 in the insulating layer 2 may be large enough to ensure that the insulating layer 2 may filter most of the dislocation lines. In one embodiment, the aspect (height to width) ratio of the trench 21 is preferably larger than about 1. When the aspect (height to width) ratio of the trench 21 is smaller than 1, the dislocation lines may extend to an upper surface of the first buffer layer 3. However, when the aspect (height to width) ratio of the trench 21 is too large, the chemical vapor deposition process may not be performed easily. In this embodiment, the aspect (height to width) ratio of the trench 21 may be smaller than 10. In view of inclination angles of the dislocation lines and the chemical vapor deposition process, the aspect (height to width) ratio of the trench 21 is preferably larger than about 2 and smaller than about 5. In this way, not only may the insulating layer 2 filter the dislocation lines, but also may the low temperature chemical vapor deposition process be performed easily.

The compound semiconductor layer 4 is formed on the first buffer layer 3. Materials for forming the compound semiconductor layer 4 may be GaAs, InGaAs, InSb, InP, InAlAs, AlGaAs, or any combination thereof. In one example, the combination may comprise a heterojunction structure. The heterojunction structure may include, but is not limited to, a three-layer potential well structure with two wide bandgap semiconductor layers sandwiching one narrow bandgap semiconductor layer, for example, a InGaAs/InSb/InGaAs structure. Because the upper surface of the first buffer layer 3 has a good crystal structure, the compound semiconductor layer 4 may have an excellent crystal structure. Preferably, the compound semiconductor layer 4 may be formed by a low-temperature metal organic chemical vapor deposition (MOCVD) process, for example, at a temperature between 200° C. and 600° C., so that the compound semiconductor layer 4 may have a low defect density and an ideal crystal structure to fabricate a device such as a transistor with high mobility.

It should be noted that strained and nonstrained compound semiconductor layers 4 may be provided. For example, a lattice mismatch between GaAs and Ge is 0.08%, and after 1.5 at. % In is added, GaAs will match perfectly with Ge. When the first buffer layer 3 is a Ge layer, the compound semiconductor layer 4 of GaAs is strained, and the compound semiconductor layer 4 of InGaAs is nonstrained, in which a content of In is 1.5 at. %. In addition, strain properties of the compound semiconductor layer 4 may be adjusted by changing compositions of the compound semiconductor layer 4 and the first buffer layer 3 as well as contents of the compositions in the compound semiconductor layer 4 and the first buffer layer 3 according to a conduction type of the device such as n type and p type. This may be further used to adjust a carrier mobility of a transistor channel.

Figure 2:
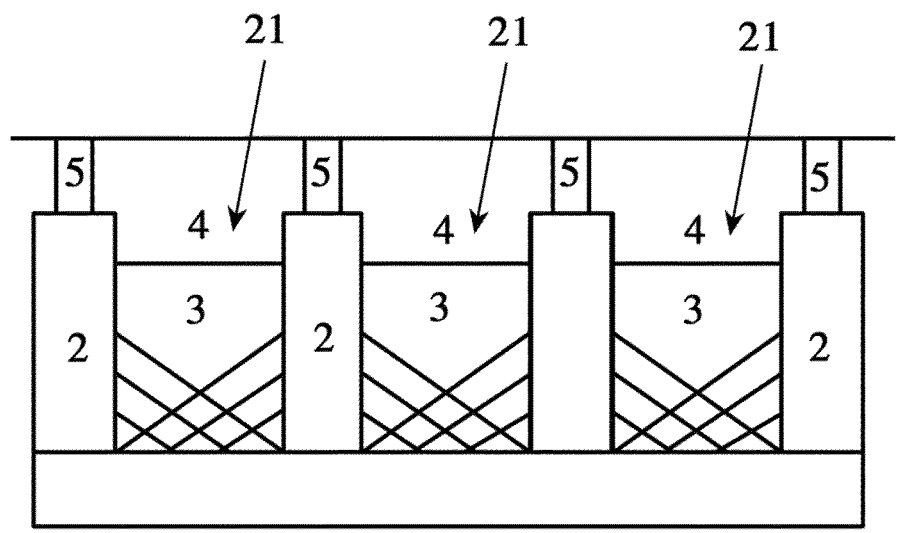
FIG. 2 is a cross-sectional view of a semiconductor device according to another exemplary embodiment of the present disclosure.

FIG. 2 shows a semiconductor device according to another exemplary embodiment of the present disclosure. In FIGS. 1-2, the same or similar elements and elements having the same or similar functions are denoted by like reference numerals. The semiconductor device in FIG. 2 is substantially the same as the semiconductor device in FIG. 1, except the following structures.

In the semiconductor device shown in FIG. 2, a plurality of trenches 21 are formed in the insulating layer 2. The compound semiconductor layer 4 may not only be formed on the first buffer layer 3 in the trench 21, but also may further extend laterally onto an upper surface of the insulating layer 2. An isolation structure 5 is formed on the insulating layer 2 between adjacent trenches 21 so as to isolate adjacent semiconductor layers 4. The isolation structure 5 may be of a dielectric, such as $SiO_2$ or $Si_3N_4$.

In this embodiment, the compound semiconductor layer 4 is formed epitaxially on the first buffer layer 3 in the trench 21. As described above, the compound semiconductor layer 4 has a low dislocation density and a smooth surface. In addition, since the compound semiconductor layer 4 extends out of the trench 21 and laterally extends onto the upper surface of the insulating layer 2, a utilization rate of a wafer area may be improved. Moreover, as will be described below, in this exemplary embodiment, the compound semiconductor layer 4 may have a flat surface.

Figure 3:
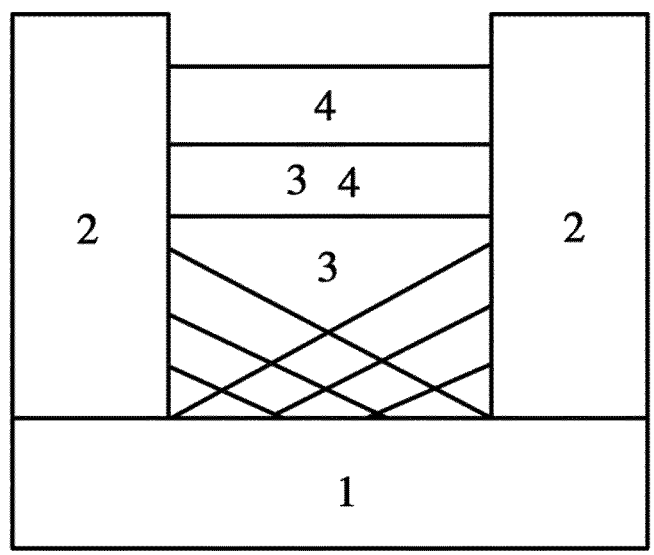
FIG. 3 is a cross-sectional view of a semiconductor device according to still another exemplary embodiment of the present disclosure.

FIG. 3 shows a semiconductor device according to still another embodiment of the present disclosure. In FIG. 1 and FIG. 3, the same or similar elements and elements having the same or similar functions are denoted by like reference numerals. The semiconductor device in FIG. 3 is substantially the same as the semiconductor device in FIG. 1, except the following structures.

As shown in FIG. 3, the semiconductor device according to this exemplary embodiment further comprises a second buffer layer 34 between the first buffer layer 3 and the compound semiconductor layer 4. As described above, the upper surface of the first buffer layer 3 may have a low dislocation density and a good crystal structure. By inserting the second buffer layer 34 between the first buffer layer 3 and the compound semiconductor layer 4, a defect density of a crystal may be further reduced, and a stress in the compound semiconductor layer 4 may be adjusted flexibly. In other words, a material of the second buffer layer 34 may be selected according to a material of the compound semiconductor layer 4 and a required stress. The second buffer layer 34 may comprise, for example, GaAs, AlGaAs, InAlAs, AlInSb, InP, InGaAs, or any combination thereof. The second buffer layer 34 may be formed by the low-temperature metal organic chemical vapor deposition process at a temperature between 200° C. and 600° C., for example.

Hereinafter, a method for forming a semiconductor device according to an embodiment of the present disclosure will be described with reference to FIGS. 4A-4E.

Figure 4A:
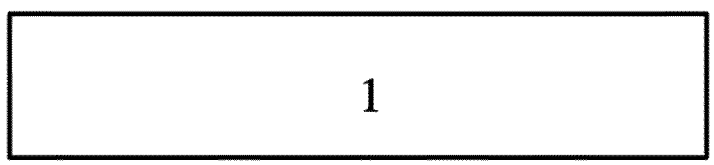
FIGS. 4A-4E are cross-sectional diagrams of intermediate statuses of a semiconductor structure formed during a process of a method for forming the semiconductor device according to an exemplary embodiment of the present disclosure.

As shown in FIG. 4A, a substrate 1 is provided. The substrate 1 may be a semiconductor substrate, including, but not limited to, a Si substrate, a SOI substrate, and a SiGe substrate with low Ge content. According to the requirement, the upper surface of the substrate 1 may be a predetermined crystal plane. For example, the substrate 1 may be a Si substrate, the upper surface of which may be a (100) crystal plane. In another example, the substrate 1 may also comprise a SiGe layer (not shown) with low Ge content formed epitaxially on the Si substrate, in which the content of Ge is not larger than 30 at. %, for example.

Figure 4B:
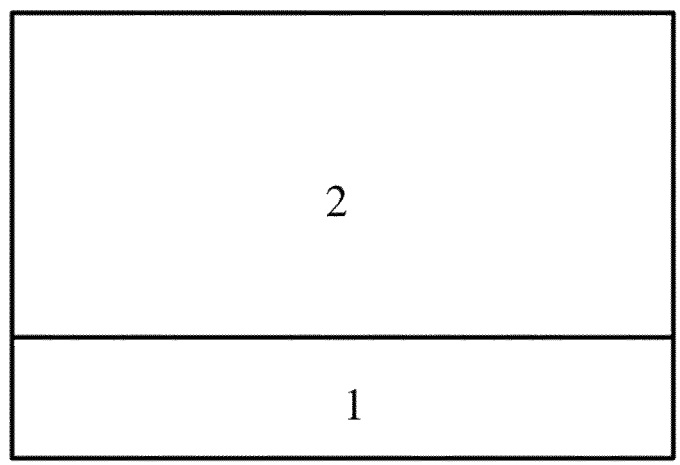

As shown in FIG. 4B, an insulating layer 2 is formed on the substrate 1. The insulating layer 2 may be of a dielectric material, including, but not limited to, $SiO_2$ and $Si_3N_4$. A method for forming the insulating layer 2 may include, but is not limited to, a thermal oxidation method, a sputtering deposition method, and a chemical vapor deposition method such as a low pressure chemical vapor deposition method or a plasma enhanced chemical vapor deposition method. According to different requirements, a thickness of the insulating layer 2 may range from tens of nanometers to several microns, for example.

Figure 4C:
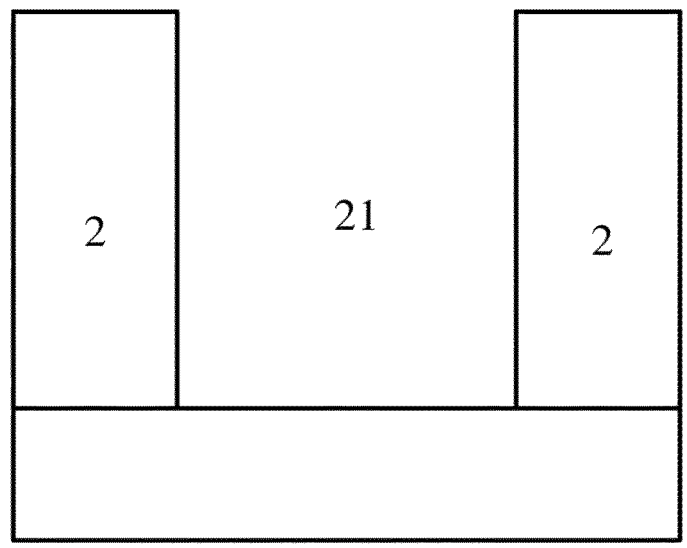

Referring to FIG. 4C, a trench 21 is formed in the insulating layer 2 to expose the upper surface of the substrate 1. The trench 21 may also be a hole. The hole may have any shape, including, but not limited to, a rectangle, a square, a circle, and an ellipse. Preferably, the trench 21 may be a hole of a rectangle shape or an ellipse shape, and a length direction of the rectangle or a long axis of the ellipse is parallel to a <100> or <110> crystallographic orientation of the Si substrate. The <100> or <110> crystallographic orientation of the Si substrate may be a carrier transfer direction in a channel in the semiconductor device formed during a subsequent process, thus obtaining a large carrier mobility. A method for forming the trench 21 may comprise steps of: forming a photoresist layer on the insulating layer 2, forming a photoresist pattern by exposure and development processes, and etching the insulating layer 2 using the photoresist pattern as a mask to form the trench 21. A size of the trench 21 may be determined according to the requirement. It should be noted that, an aspect (height to width) ratio of the trench 21 may be larger than about 1, preferably, larger than about 1 and smaller than about 10, and more preferably, larger than about 2 and smaller than about 5. Although FIG. 4C only shows one trench 21, a plurality of trenches 21 may be formed in the insulating layer 2.

Figure 4D:
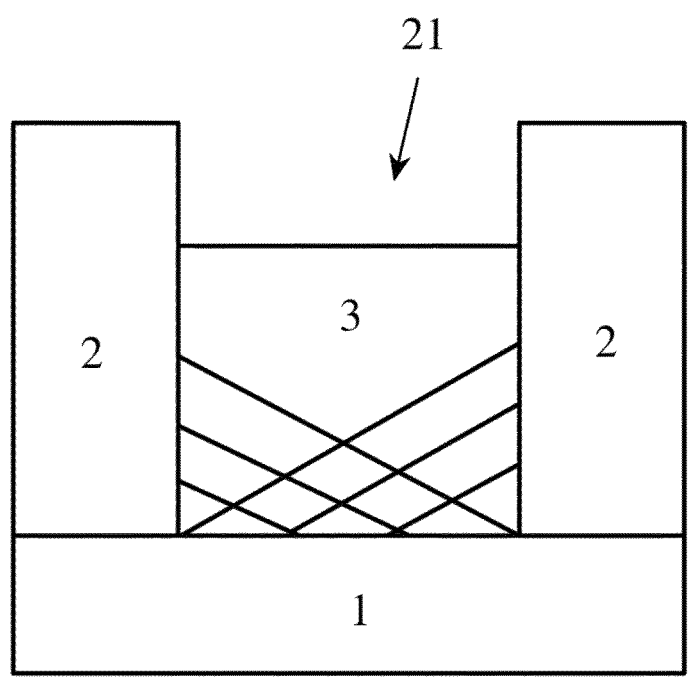

Then, as shown in FIG. 4D, a first buffer layer 3 is formed epitaxially on the exposed surface of the substrate 1 in the trench 21 by the low-temperature reduced pressure chemical vapor deposition (RPCVD) process, for example, at a temperature between 200° C. and 500° C., and preferably, at a temperature between 350° C. and 500° C. The first buffer layer 3 may be, for example, a Ge layer, a SiGe layer with high Ge content, or a layer with a combination of Ge and SiGe with high Ge content. For example, in one example, in a reduced pressure chemical vapor deposition equipment, using $GeH_4$ as a precursor, a Ge buffer layer 3 is formed epitaxially at a temperature lower than 500° C.; or using $GeH_4$ and $SiH_4$ as precursors, a SiGe buffer layer 3 with high Ge content is formed epitaxially at a temperature lower than 500° C. The content of Ge in the SiGe buffer layer 3 may be adjusted by adjusting a flow rate of the precursor. For example, in one example, at a temperature of 500° C., a flow rate of $GeH_4$ is 400 sccm, and the flow rate of $SiH_4$ is 0.05 slm, so that the content of Ge in the formed SiGe buffer layer 3 is 87 at. %. In another example, at a temperature of 500° C., the flow rate of $GeH_4$ is 200 sccm, and the flow rate of $SiH_4$ is 0.05 slm, so that the content of Ge in the formed SiGe buffer layer 3 is 53 at. %. In still another example, at a temperature of 450° C., the flow rate of $GeH_4$ is 450 sccm, and the flow rate of $SiH_4$ is 0.05 slm, so that the content of Ge in the formed SiGe buffer layer 3 is 92 at. %.

As described above, at a low temperature, dislocation lines in the first buffer layer 3 formed by the reduced pressure chemical vapor deposition process extend in an oblique direction, so that the dislocation lines will be stopped at an interface between the first buffer layer 3 and the insulating layer 2. Since the aspect (height to width) ratio of the trench 21 is larger than 1, the insulating layer 2 may block most of the dislocation lines in the first buffer layer 3. In this way, the first buffer layer 3 may have a low dislocation density, and consequently may obtain a good crystal structure and a smooth surface. In some embodiments, the first buffer layer 3 has a dislocation density lower than $104\ cm^{-2}$ and a surface roughness smaller than 1 nm.

In one embodiment, when the first buffer layer 3 is formed epitaxially, a HCl gas with a predetermined flow rate, for example, a HCl gas with a flow rate of 0.10 slm, may be introduced in a growth chamber to reduce a nucleation probability and a growth rate of Ge or SiGe with high Ge content on the insulating layer 2 of, for example, $SiO_2$, so that Ge or SiGe with high Ge content may be both formed epitaxially on a surface of the substrate 1 in the trench 21. Therefore, a growth selectivity of the first buffer layer 3 may be increased.

Although it is not shown in FIGS. 4A-4E, after the first buffer layer 3 is formed, a second buffer layer 34 is also formed on the first buffer layer 3. As described above, by inserting the second buffer layer 34 between the first buffer layer 3 and the compound semiconductor layer 4, a defect density of a crystal may be further reduced, and a stress in the compound semiconductor layer 4 may be adjusted flexibly. The material for forming the second buffer layer 34 may comprise, for example, GaAs, AlGaAs, InAlAs, AlInSb, InP, InGaAs, or any combination thereof. The second buffer layer 34 may be formed by the low-temperature metal organic chemical vapor deposition process at a temperature between 200° C. and 600° C., for example.

As shown in FIG. 5, dislocation lines caused by the lattice mismatch are mainly formed in a very thin region at an interface between Si and SiGe, and extend obliquely upwards at an angle of 60°. Dislocation lines extending vertically upwards are hardly observed. Therefore, by combining the low temperature chemical vapor deposition process with the sidewall blocking structure, since the aspect (height to width) ratio of the trench 21 is larger than about 1, most of the dislocation lines are stopped at the interface between the insulating layer 2 and the buffer layer 3.

Figure 6:
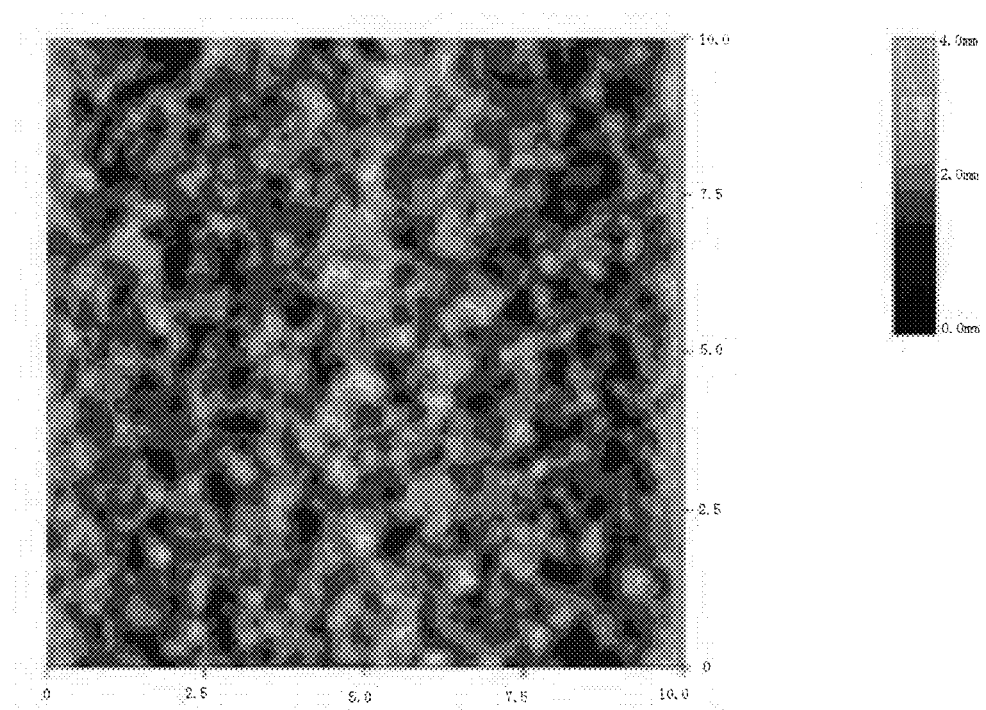
FIG. 6 shows an atomic force microscope (AFM) image of a surface of a SiGe buffer layer according to an exemplary embodiment of the present disclosure.

FIG. 6 shows an atomic force microscope (AFM) image of a surface of a SiGe buffer layer 3 formed by the low-temperature reduced pressure chemical vapor deposition process according to an exemplary embodiment of the present disclosure. The low-temperature reduced pressure chemical vapor deposition process is performed at a temperature of 500° C., and a content of Ge in the formed SiGe buffer layer 3 is 87 at. %. As shown in FIG. 6, the first buffer layer 3 has a thickness of 400 nm and a surface roughness of 0.389 nm. It may be seen that the surface of the first buffer layer 3 formed according to an embodiment of the present disclosure has low dislocation density. Therefore, the thickness of the epitaxial layer is small, and the surface roughness is very low, thus avoiding heat dissipation problems caused by large thickness.

Returning to FIG. 4E, the compound semiconductor layer 4 is formed epitaxially on the first buffer layer 3 by the metal organic chemical vapor deposition process. Materials for forming the compound semiconductor layer 4 may be GaAs, InGaAs, InSb, InP, InAlAs, AlGaAs, or any combination thereof. In one example, the combination may comprise a heterojunction structure. The heterojunction structure may include, but is not limited to, a three-layer potential well structure with two wide bandgap semiconductor layers sandwitching one narrow bandgap semiconductor layer, for example, a InGaAs/InSb/InGaAs structure. A pressure in the growth chamber may be 50-200 Torr, for example, 100 Torr, and a growth temperature may be 200-600° C., preferably, 300-550° C. According to different elements, different precursors may be used. For example, when the compound semiconductor layer 4 is of InGaAs, for the Ga element, trimethylgallium (TMGa) may be used as a precursor; for the In element, trimethylindium (TMIn) may be used as a precursor; and for the As element, tert-butylarsine (TBAs) may be used as a precursor. In one example for forming $In_{0.53}Ga_{0.47}As$, the growth temperature may be about 400° C., a molar flow rate of TMIn is $3.7 \times 10^{-5}$ mol/min, a molar flow rate of TMGa is $2.86 \times 10^{-5}$ mol/min, a molar flow rate of TBAs is $2.7 \times 10^{-3}$ mol/min, a growth time is 60 s, and a thickness is 50 nm.

As described above, since the upper surface of the first buffer layer 3 has a good crystal structure and a low roughness and the compound semiconductor layer 4 is formed on the first buffer layer 3, the compound semiconductor layer 4 may have a low defect density and a good crystal structure, and consequently may be used to fabricate a MOS device with high performance, for example, a transistor with high mobility or an optical interconnecting device.

Figure 4E:
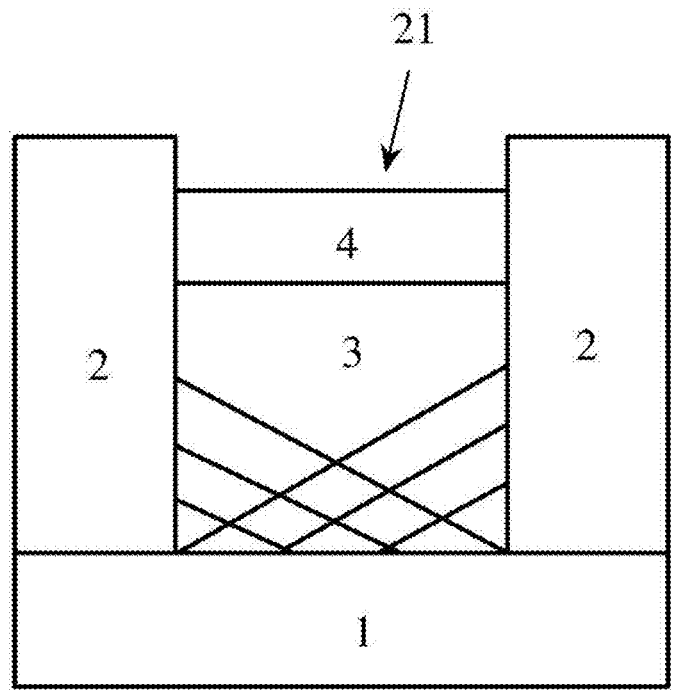
Figure 7A:
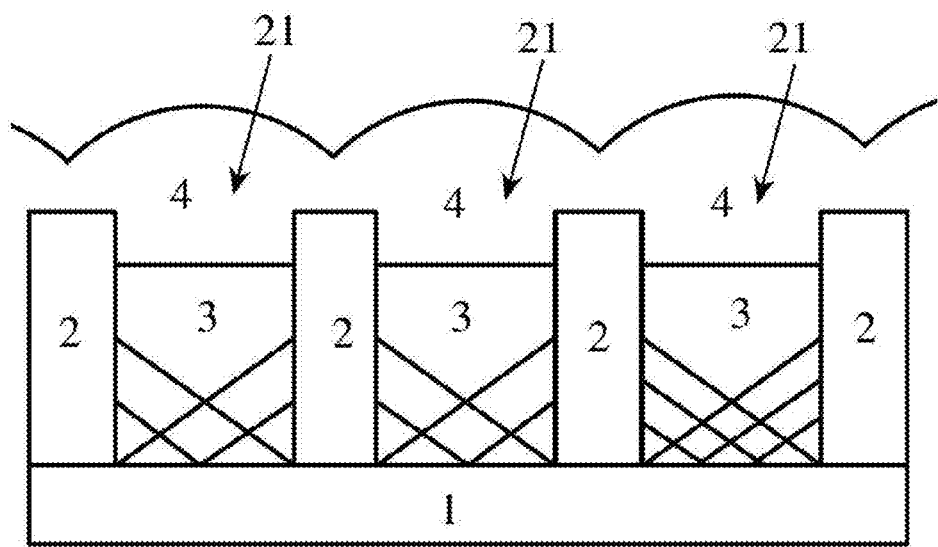
FIGS. 7A-7C are cross-sectional diagrams of intermediate statuses of a semiconductor device formed during a process of a method for forming the semiconductor device according to another exemplary embodiment of the present disclosure.

In the embodiment shown in FIG. 4E, the upper surface of the compound semiconductor layer 4 does not extend outside the trench 21. However, in another embodiment, as shown in FIG. 7A, the upper surface of the compound semiconductor layer 4 may also extend outside the trench 21. After the compound semiconductor layer 4 extends outside the trench 21, the compound semiconductor layer 4 may continue to grow laterally, so that the compound semiconductor layers 4 formed in adjacent trenches 21 may be connected with each other to form a continuous compound semiconductor layer 4 on the insulating layer 2. At this time, as shown in FIG. 7A, a part of the compound semiconductor layer 4 between adjacent trenches 21 may have a higher crystal defect density.

Figure 7B:
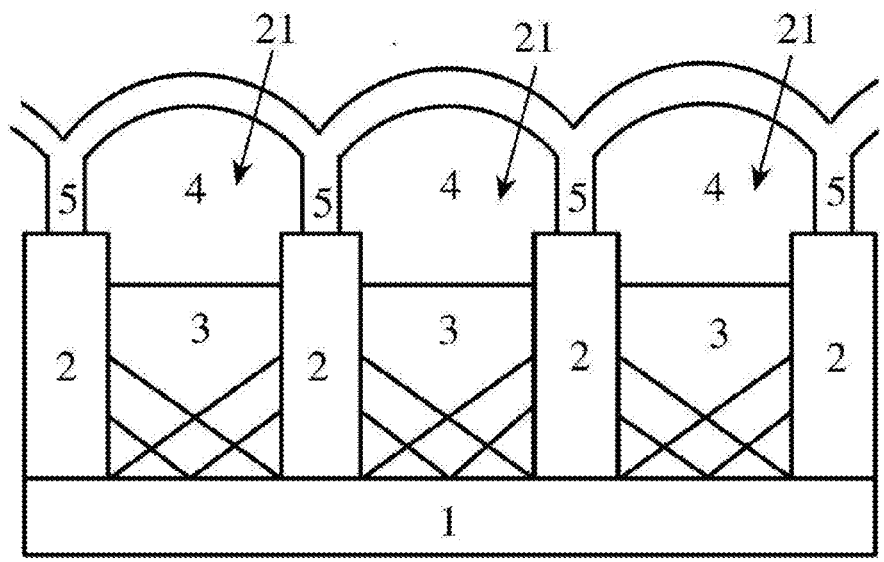

Then, as shown in FIG. 7B, the part of the compound semiconductor layer 4 between adjacent trenches 21 is removed by, for example, lithography or etching to expose a part of the insulating layer 2, and a dielectric is filled in a recess formed by lithography or etching. For example, a $SiO_2$ dielectric may be deposited by sputtering. Then, as shown in FIG. 7C, a planarization process, for example, a chemical mechanical polishing process, may be performed to obtain flat surfaces of the isolation structure 5 and of the compound semiconductor layer 4.

It should be noted that, referring to FIG. 2, due to technological errors and other factors, sizes of trenches 21 are not necessarily completely identical, so that molecular transport properties in the trench 21 may be different and consequently the growth rate may be different. Therefore, the heights of the upper surfaces of the finally formed first buffer layers 3 may be different. In the exemplary embodiment shown in FIGS. 7A-7C, the compound semiconductor layer 4 extends out of the trench 21 to form a continuous layer, thus increasing an aperture ratio and a utilization rate of the wafer surface; and because of using the planarization process, the compound semiconductor layer 4 may have a flat surface with an identical height.

Figure 7C:
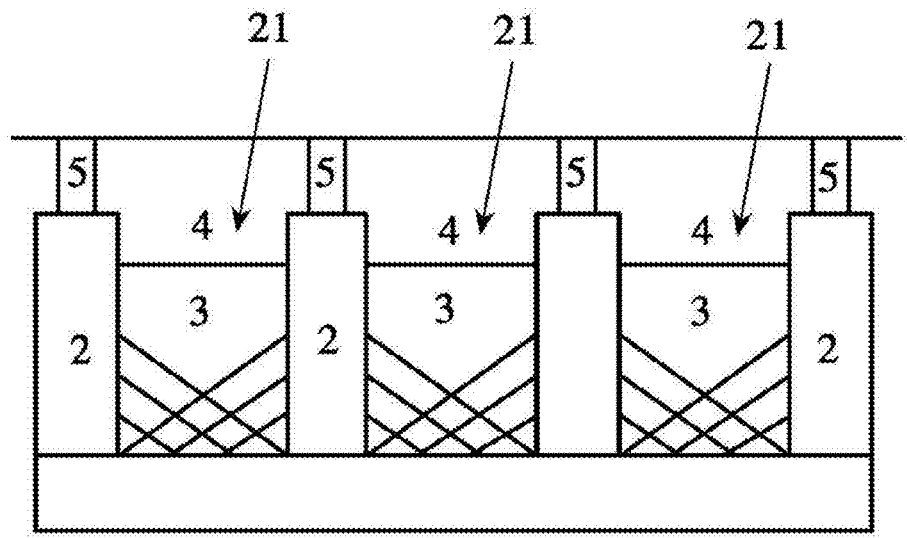

Then, a semiconductor device such as a transistor may be fabricated in the compound semiconductor layer 4 shown in FIG. 4E or FIG. 7C. The detailed process thereof will be omitted here.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A method for forming a semiconductor device, comprising:
   providing a substrate;
   forming an insulating layer on the substrate;
   forming a trench in the insulating layer to expose an upper surface of the substrate;
   forming a first buffer layer on the exposed upper surface of the substrate by a selective epitaxy, wherein the first buffer layer includes a SiGe layer in which a content of Ge increases gradually in a growth direction of the SiGe layer and the content of Ge larger than 50 at. %; and
   forming a compound semiconductor layer on the first buffer layer epitaxially,
   wherein an aspect ratio of the trench is larger than 1 and smaller than 10,
   wherein the first buffer layer is formed by a low-temperature reduced pressure chemical vapor deposition process at a temperature between 200° C. and 500° C., and
   wherein the compound semiconductor layer is formed by a low-temperature metal organic chemical vapor deposition process at a temperature between 200° C. and 600° C.

2. The method according to claim 1, wherein the compound semiconductor layer comprises GaAs, InGaAs, InSb, InP, InAlAs, AlGaAs, or any combination thereof.

3. The method according to claim 1, further comprising: before forming the compound semiconductor layer, forming a second buffer layer on the first buffer layer by the low-temperature metal organic chemical vapor deposition process at a temperature between 200° C. and 600° C.

4. The method according to claim 3, wherein the second buffer layer comprises GaAs, AlGaAs, InAlAs, AlInSb, InP, InGaAs, or any combination thereof.

5. The method according to claim 1, wherein the compound semiconductor layer is a strained layer.

6. The method according to claim 1, wherein the substrate comprises Si, SiGe with a content of Ge smaller than 30 at. %, or a combination thereof.

7. The method according to claim 1, wherein the compound semiconductor layer is formed epitaxially until the compound semiconductor layer fills the trench and laterally extends onto the insulating layer.

8. A semiconductor device, comprising:
a substrate;
an insulating layer, formed on the substrate and having a trench to expose an upper surface of the substrate;
a first buffer layer, formed on the substrate and in the trench; and
a compound semiconductor layer, formed on the first buffer layer,
wherein an aspect ratio of the trench is larger than 1 and smaller than 10,
wherein the first buffer layer is formed by a low-temperature reduced pressure chemical vapor deposition process at a temperature between 200° C. and 500° C.,
wherein the compound semiconductor layer is formed by a low-temperature metal organic chemical vapor deposition process at a temperature between 200° C. and 600° C., and wherein the first buffer layer includes a SiGe layer in which a content of Ge increases gradually in a growth direction of the SiGe layer and the content of Ge larger than 50 at %.

9. The semiconductor device according to claim 8, wherein the compound semiconductor layer comprises GaAs, InGaAs, InSb, InP, InAlAs, AlGaAs, or any combination thereof.

10. The semiconductor device according to claim 8, further comprising: a second buffer layer formed between the first buffer layer and the compound semiconductor layer.

11. The semiconductor device according to claim 10, wherein the second buffer layer comprises GaAs, AlGaAs, InAlAs, AlInSb, InP, InGaAs, or any combination thereof.

12. The semiconductor device according to claim 10, wherein the second buffer layer is formed by the low-temperature metal organic chemical vapor deposition process at a temperature between 200° C. and 600° C.

13. The semiconductor device according to claim 8, wherein the compound semiconductor layer is a strained layer.

14. The semiconductor device according to claim 8, wherein the substrate comprises Si, SiGe with a content of Ge smaller than 30 at. %, or a combination thereof.

15. The semiconductor device according to claim 8, wherein the compound semiconductor layer fills the trench and laterally extends onto the insulating layer.

* * * * *